United States Patent
Hommelgaard et al.

(10) Patent No.: US 9,601,203 B2
(45) Date of Patent: Mar. 21, 2017

(54) FLOATING GATE NON-VOLATILE MEMORY BIT CELL

(75) Inventors: Mads Hommelgaard, Kirkland, WA (US); Andrew Horch, Seattle, WA (US); Martin Niset, Seattle, WA (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 13/492,811

(22) Filed: Jun. 9, 2012

(65) Prior Publication Data

US 2013/0328117 A1    Dec. 12, 2013

(51) Int. Cl.
*H01L 27/115* (2006.01)
*G11C 16/04* (2006.01)
*H01L 29/788* (2006.01)
*H01L 29/08* (2006.01)

(52) U.S. Cl.
CPC ...... *G11C 16/0441* (2013.01); *H01L 27/1156* (2013.01); *H01L 27/11524* (2013.01); *H01L 29/0847* (2013.01); *H01L 29/7881* (2013.01)

(58) Field of Classification Search
CPC .......... H01L 27/115; H01L 27/11521
USPC ............. 257/315, 316; 365/185.09, 185.18; 438/306
See application file for complete search history.

(56) References Cited

U.S. PATENT DOCUMENTS

| | | | |
|---|---|---|---|
| 7,474,568 B2 | 1/2009 | Horch | |
| 7,652,321 B2* | 1/2010 | Yamaguchi | H01L 21/84 257/316 |
| 7,679,957 B2 | 3/2010 | Ma et al. | |
| 7,808,823 B2* | 10/2010 | Ma et al. | 365/185.09 |
| 8,687,428 B2* | 4/2014 | He et al. | 365/185.2 |
| 2004/0004861 A1* | 1/2004 | Srinivas | G11C 16/0441 365/185.21 |
| 2010/0188901 A1* | 7/2010 | Pikhay | G11C 16/0441 365/185.18 |
| 2010/0244152 A1* | 9/2010 | Bahl | H01L 21/26513 257/408 |
| 2012/0039107 A1* | 2/2012 | Chung | G11C 17/12 365/104 |

\* cited by examiner

*Primary Examiner* — Kenneth Parker
*Assistant Examiner* — Warren H Kilpatrick
(74) *Attorney, Agent, or Firm* — Alston & Bird LLP

(57) ABSTRACT

A solid-state non-volatile memory (NVM) device includes a memory bit cell. The memory bit cell includes a field effect transistor (FET) fabricated on a substrate and having a floating gate. The floating gate includes a thick oxide layer. The FET includes drain and source, each fabricated within the substrate and coupled to the floating gate and a channel region with native doping. The drain is fabricated to have a halo region. A method for fabricating a solid-state NVM device includes fabricating solid state device including NVM bit cell which provides multiple storage and includes an FET on substrate. The method also includes fabricating floating gate of the FET including thick gate oxide layer, and fabricating drain and source of FET within the substrate, drain and source coupled to the floating gate and channel region with native doping. Further, the method includes fabricating halo region within the substrate at the drain.

10 Claims, 5 Drawing Sheets

FLOATING GATE NON-VOLATILE MEMORY BIT CELL

TECHNICAL FIELD

The present subject matter generally relates to the field of semiconductor fabrication, and pertains to memory cells.

BACKGROUND

Many semiconductor devices employ memory, which can be in the form of individual cells, or cells organized into arrays, typically two-dimensional arrays. Latency time for reading a memory cell preferably should be as small as possible.

Several types of memory technology have been employed. One such memory technology is a differential bit cell design. Such a bit cell design employs two current pathways (that is, two sides, which can for instance be in a bistable configuration). For some such designs, at a given time one side is conducting current, and other side is not. The differential bit cell design provides reliability, in that a differential bit cell can be correctly read, even if one of the two sides fails to hold a correct voltage value.

However, if the differential bit cell is regarded as undesirably large, then a smaller bit cell, employing only a single floating gate device per bit, can be a preferable alternative. Such a single-ended memory has only about half as many data lines as the differential bit cell and typically takes less dynamic power (that is, switching power which is related to switching frequency) to read it. Power reduction is due to having half a number of the data lines to pre-charge and discharge during a read operation. The data lines typically run a length of a dense array and connect to bitcells on a logical column. The data lines typically have a lot of capacitance that takes a lot of power to charge and discharge.

Yet a third type of bit cell, called a redundant bit cell, stores data in two memory elements that are programmed to a same state. The data lines for the two memory elements can be shorted together, since the two memory elements always have the same state. The redundant bit cell has most of reliability advantages of the differential bit cell, but with only half the data lines it takes less dynamic power to read it.

Non-volatile memory (NVM) is a memory technology which has provided advantageous reductions in power consumption, relative to other technologies. NVM retains its stored bit value data if power is cycled down, and then backed up. Therefore, the data which is only intermittently accessed can be stored in NVM, with advantageous power savings.

In addition, certain applications for the memory technology make particular requirements. For instance, a radio-frequency identification device (commonly called an RFID tag) will typically include a small amount of information stored in memory cells, and will not have an independent on-board power source. Rather, the RFID tag reader produces an electromagnetic field, which provides power to the RFID tag when it is sufficiently nearby. The power enables a reader to wirelessly read the information in the memory of the RFID tag.

SUMMARY

An example of a solid-state non-volatile memory device includes a memory bit cell that provides multiple storage. The memory bit cell includes a field effect transistor (FET) fabricated on a substrate and having a floating gate. The floating gate includes a thick oxide layer. The FET includes a drain and a source, each fabricated within the substrate and coupled to the floating gate and a channel region with native doping. The drain is fabricated within the substrate to have a halo region.

An example of a method for fabricating a solid-state non-volatile memory device includes fabricating a solid state device including a non-volatile memory bit cell which provides multiple storage and which includes a field-effect transistor (FET) on a substrate. The method also includes fabricating a floating gate of the FET including a thick gate oxide layer. The method further includes fabricating a drain and a source of the FET within the substrate, the drain and the source being coupled to the floating gate and a channel region with native doping. Further, the method includes fabricating a halo region within the substrate at the drain.

An example of a radio frequency identification (RFID) tag device includes a carrier, an antenna on the carrier, and a solid-state semiconductor device on the carrier. The solid-state semiconductor device includes a non-volatile memory bit cell providing multiple storage where the non-volatile memory bit cell includes an FET fabricated on a substrate and having a floating gate, the floating gate includes a thick gate oxide layer, the FET includes a drain and a source, each fabricated within the substrate and coupled to the floating gate, the drain fabricated within the substrate to have a halo region, and the non-volatile memory bit cell includes a plurality of redundant floating gates for storing data to be read from the RFID tag device.

An example of a battery-powered electronic device includes a device. The device includes a non-volatile memory bit cell providing multiple storage. The non-volatile memory bit cell includes an FET fabricated on a substrate and having a floating gate which includes a thick gate oxide layer, the FET including a drain and a source, each fabricated within the substrate and coupled to the floating gate, the drain being fabricated within the substrate to have a halo region. The non-volatile memory bit cell further includes a plurality of redundant memory elements having floating gates for storing data to be read from the device.

Further features and advantages of embodiments of the disclosed subject matter, as well as the structure and operation of preferred embodiments, are described in detail below with reference to the accompanying exemplary drawings.

BRIEF DESCRIPTION OF THE VIEWS OF DRAWINGS

In the accompanying figures, similar reference numerals may refer to identical or functionally similar elements. These reference numerals are used in the detailed description to illustrate various embodiments and to explain various aspects and advantages of the present disclosure.

DETAILED DESCRIPTION

CMOS Processes; Native Device

Figure 1:
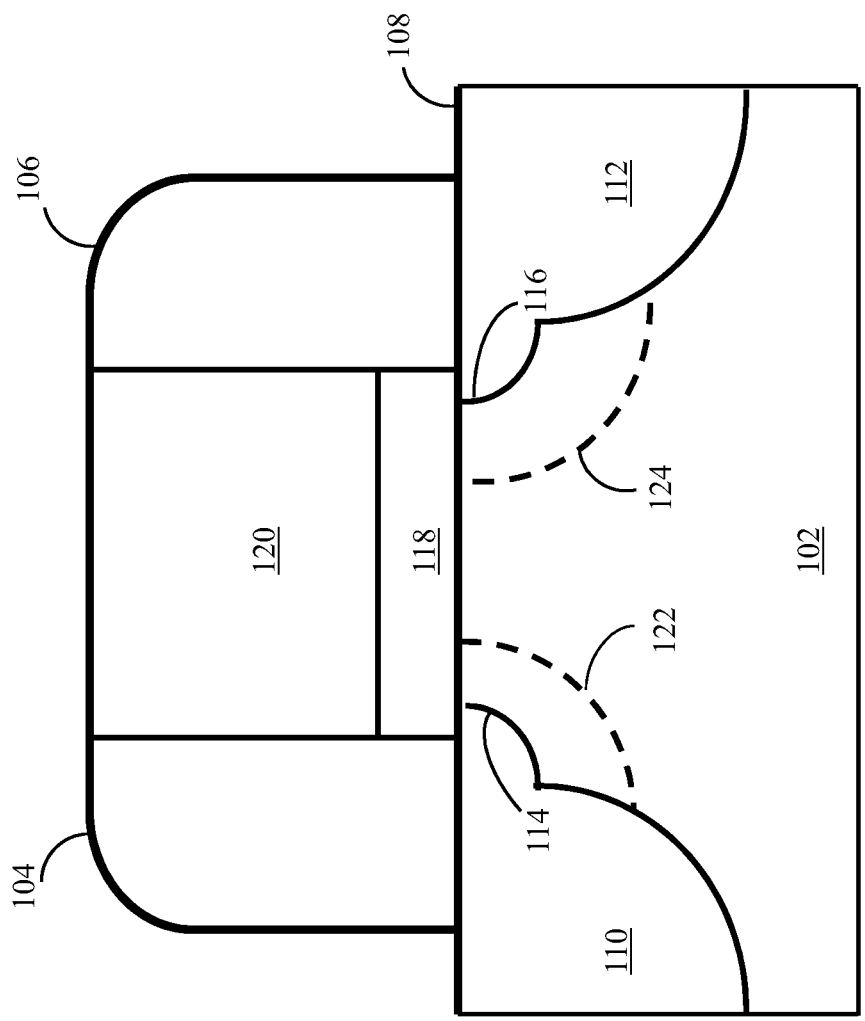
FIG. 1 is a semiconductor fabrication block diagram of an active element, in accordance with one embodiment.

Many semiconductor devices, for example memory cells discussed above, can include field effect transistors (FETs) which are fabricated to have a native device. The native device is a device that does not include any process step to add dopants into a channel region of a device. Rather, channel region dopant level is set by dopant level in a wafer.

During fabrication of the wafer, a low level of dopant is typically added (doping in molten silicon prior to silicon ingot being pulled). This forms a uniform light doping throughout the wafer. Standard logic complementary metal oxide semiconductor (CMOS) processes typically use wafers with on the order of $10^{15}$ boron atoms per $cm^3$. Some logic processes use wafers with a higher doping level and then grow an epitaxial layer on top of the wafer with same light doping level. A native device uses this light surface doping level as doping level in the channel region. No additional dopants are added in the channel region during device fabrication. A device with very light channel doping will have a very low threshold voltage (VT). Such a native device structure has a low VT. In certain applications, for example memory circuits, the low VT allows for low voltage reading of stored data.

Uniform doping is typically formed with one of the following three options: (1) The doping a wafer is made with (doping in the molten silicon prior to the silicon ingot being pulled). This is called substrate doping. (2) A uniformly doped epitaxial layer grown on the surface of the wafer (incorporated into the semiconductor as it is deposited). This is sometimes also called substrate doping. (3) Uniform surface doping of the wafer, without any selective doping. This can be made by a blanket implant or dopant diffusion, with no blocking layers on the wafer, and is commonly known as blanket surface doping.

Typical standard logic CMOS processes come with two gate oxide thicknesses. A thin gate oxide used in core logic devices. The core logic devices are optimized to be small and fast. A thicker gate oxide is used for devices used in chip I/O (input/output) circuits. Typically I/O circuits need to drive connections between chips. The connections between the chips are long and have a lot of capacitance and inductance. To make chip interconnects work correctly a higher I/O voltage is needed. To support the higher I/O voltage a set of I/O devices is used with an appropriately thick gate oxide. This gate oxide is typically thick enough to support a floating gate non-volatile memory (NVM) element.

Memory Cell Design Examples

Some solid state circuit designs can employ an FET having a floating gate, that is, a gate not directly connected to receive an input signal or voltage. The floating gate has a certain amount of capacitance, and in operation, for example program or erase, stores a certain amount of electrical charge. Amount of the electrical charge a given floating gate can hold depends on various factors, for example thickness of the gate oxide layer and size of the floating gate. In the present disclosure, floating gate will also be given in abbreviation, as FG.

The thickness of the gate oxide layer can vary based on various design factors, but for the present disclosure a distinction will be made between thick and thin gate oxide layers: A gate oxide layer in a floating gate non-volatile memory cell is considered thick if it is thick enough to hold sufficient charge to enable the NVM cell to store data for a required time. If thickness is insufficient to hold such charge, then the gate oxide layer is considered thin. In semiconductor memory cell designs such as those listed above, active elements (for example, FETs) which actually store the data generally have thick oxide layers, while the active elements serving other purposes (for example, logic functions) might have thin oxide layers.

Native devices have low threshold voltages VT, that can make the native devices susceptible to punch through. The punch through occurs when depletion region from source and drain connect when the device is in an off (low current) state. The punch through is an undesirable leakage. The punch through can be avoided by moving the source and drain further apart, increasing channel length of the device. But, moving the source and drain further apart increases device size and reduces drive strength of the device. In one embodiment, a device with low VT and a short channel length is desired.

It was stated above that two different types of memory cells, differential and redundant, provide multiple forms of data storage. A differential memory cell provides multiple storage, in that there are two current pathways, that is first and second pathways. Each current pathway can include one or more active devices, for example FETs, and each pathway independently stores the data, for example in form of a voltage value composed of electrical charge that leaks away slowly enough that the voltage value can still be read as a data value when reading the value is needed. The data value that is stored takes opposite voltage values in the two pathways, for instance, the voltage values in the first and second pathways respectively representing a logic 1 and a logic 0 for one data bit state, and a logic 0 and a logic 1 for opposite data bit state. As noted above, the data stored in a differential memory cell can be correctly read, even if one of the two current pathways has failed to hold the electrical charge for the voltage value. A redundant memory cell also provides multiple storage, in that it has two memory elements, for instance two active elements for example FETs, in same state. The stored data value can also be correctly read even if one of the memory elements has failed to hold its value. Therefore, it can be said generically that a class of memory cells that provide multiple storage, includes differential and redundant cells, and can potentially include other types of memory cells having in common that a storage element can fail to hold the stored data value without causing the memory cell, overall, to lose the stored data.

Charge Neutral Point

In a floating gate device, for example a non-volatile memory, the floating gate has a characteristic called a charge neutral point, hereinafter also referred to as a neutral point. The neutral point is a voltage toward which the FG moves, as charge leaks away over time. The neutral point can be, but isn't always necessarily, zero or ground potential. The charge neutral point depends on biasing of the bitcell. RFID products can spend a large amount of time in an unbiased state (no power). In the unbiased state, everything is at ground.

As noted above, solid-state devices employing memory will generally have a combination of memory cells (or I/O circuitry), and logic circuitry. Considering each one separately, when a memory device is not powered, non-floating nodes will be at ground. When the memory is idle in low power products, typically, everything is powered off (set to ground). For an NMOS device in a standard logic process, the p-type substrate is typically set at ground.

For an NMOS device in a standard logic process (built with a P-type wafer, and no deep n-type wells) the charge neutral point is almost always ground, when unbiased. When the floating gate leaks, it almost always leaks to ground.

Leakage rate onto/off the FG is exponentially dependant on electric field present at the FG. As the FG voltage approached the charge neutral point the e-field drops, which in turn causes the leakage rate to drop. Where the FG is storing a data bit, there is eventually a failure point (that is, a voltage), at which the data bit can no longer be read accurately. Over time, the charge leakage moves the FG voltage from the stored data value toward the neutral point, passing through the failure point along the way. To maximize retention time of the floating gate, the failure point should be as close to the charge neutral point as possible.

Potentially, a floating gate device can leak charge until the device reaches the charge neutral point. In such a case, operation of the device can be degraded. For example, an essential function of a memory cell is to preserve the stored data without loss or degradation. However, leakage to the charge neutral point is not necessarily a problem with some memory cell designs.

If a differential bitcell, or the memory elements of a redundant bitcell, have states that straddle the charge neutral point, then the stored data can be accurately read even if one of the elements has leaked to the charge neutral point. Straddling the neutral point refers to having voltage values on opposite sides of the neutral point, for example, one above the charge neutral point and one below. For the memory cell as a whole to have a given bit value, one or the other, or both of the memory elements should have the appropriate voltage value. Thus, if one memory element leaks to the charge neutral point, but the other retains its non-neutral value, then the stored bit value can still be read from the memory cell. The bit value is lost only if both memory elements leak to the charge neutral point. If one of the memory elements changed its value, beyond the neutral point, so that both memory elements were on the same side of the neutral point, then the bit value would be lost, or read erroneously. However, this would indicate a defect in the bitcell circuitry: mere leakage would be sufficient only to make the memory element go to the charge neutral point, not to go beyond it.

An example of how a redundant native NMOS bitcell can be fabricated and can operate, is as follows. Typically, thick gate native NMOS devices in a standard logic process have a very low VT. A common VT value for a native NMOS is −0.2V. This compares to at VT of 0.7 for normal (that is, enhanced or not native) thick gate NMOS device. If a floating gate redundant bitcell has two floating gates connected to a data line, then those floating gates can be programmed to +1V for on state (hard on) and −1V for off state (hard off). Since floating gates are programmed to the same state, a reference current is used to determine state of the bitcell. One possible reference current circuit can use same two devices to read the floating gate with corresponding gates shorted to 0V (weakly on). If both floating gates are supposed to be on (+1V), but one leaks to 0V, then the combination of one FG at +1V and one FG at 0V will produce more current than the reference circuit with both devices at 0V. If both floating gates are supposed to be off (−1V) and one leaks to 0V, the combination of one FG at −1V and one FG at 0V will produce less current than the reference circuit with both devices at 0V.

If the VT of a native NMOS device is increased slightly, then punch through resistance is improved. Then, native device length can be reduced, while keeping the VT close to the charge neutral point, without any changes in the process. For example, if the VT was increased from −0.2V to +0.2V, then the redundant bitcell would work, provided the reference circuit gate voltage was increased from 0V to +0.3V.

Such a low VT device can operate with very low voltages. For instance, it is desirable for RFID tags to be able to operate with lower than normal voltages (see discussion below).

Combination of Thick Gate Native Device and Halo Implant

In an embodiment, a solid-state non-volatile memory device includes a semiconductor memory bit cell providing multiple storage. Further aspects of the memory bit cell of the embodiment will be discussed below. However, one element of the semiconductor memory cell is an active element, for example, an FET, fabricated to have a thick oxide native device, and a halo implant. This combines the thick gate oxide of a data storage or I/O element, with the halo structure that might be used in a thin gate logic element. A device is thus produced, which retains charge for a floating gate non-volatile memory, due to the thick gate, and which also reduces the length of the gate between the drain and the source, to produce a smaller bitcell. Also, the threshold voltage VT is increased to a level between a native and a normal enhanced device.

FIG. 1 is a cross-sectional diagram illustrating fabrication of a logic or core FET on a substrate 102. Spacers 104 and 106 are provided on a surface 108 of the substrate 102. Source and drain regions 110 and 112, respectively, are produced within the substrate 102. The source 110 and the drain 112, formed within the substrate 102, include extensions shown as bulges 114 and 116, or lateral diffused dopants (LDD), extending laterally toward each other, beneath the thick gate oxide layers (to be described below).

The LDD 114 and 116 connect the source 110 and the drain 112 to the channel between the spacers 104 and 106. Typically the LDD have a lower doping concentration than the source 110 and the drain 112 themselves. An alternative is called Source/Drain Extension. This performs the same function as LDD, but has a dopant concentration similar to that of the source 110 and drain 112 regions themselves; hence the name S/D Ext. is used, rather than the name LDD.

A gate oxide layer 118 is formed, as part of a native device, on the surface 108 of the substrate 102, between the spacers 104 and 106, and then a gate 120 is formed above the gate oxide layer 118. The gate 120 is a floating gate, in that it does not have a direct connection to other circuit components or fabricated structures.

In an embodiment of the device used in the floating gate bitcell, the gate oxide layer is of a thickness sufficient to store charge in the floating gate whether the bitcell is powered or not.

Additionally, doped halo regions 122 and 124, abutting the source 110 and the drain 112 and/or the LDD or S/D Ext. 114 and 116, are formed in the substrate 102. The halo regions 122 and 124 reduce the minimum length L that the gate 120 needs to be (that is, the distance between the drain 112 and source 110 structures). Also, the halo regions 122 and 124 increase the threshold voltage VT. The halo regions 122 and 124 also help to prevent punch through on short channel devices.

Figure 2:
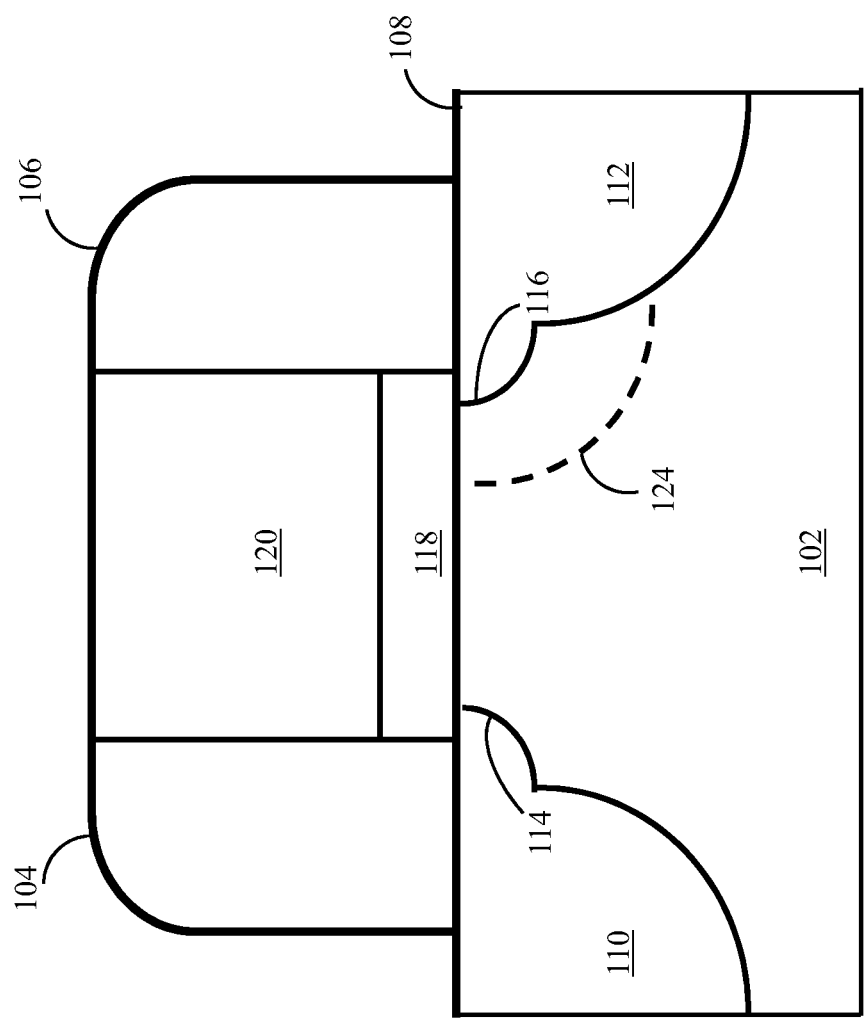
FIG. 2 is a semiconductor fabrication block diagram of another active element, in accordance with another embodiment.

FIG. 2 is a cross-sectional diagram illustrating the fabrication of another FET on a substrate. This is similar to the device shown in FIG. 1, except that only one doped halo region 124 is shown, which can be for either the source 110 or the drain 112, but in this illustrated embodiment is for the drain 112. This device uses the gate oxide 118 from the I/O device. One side of the gate 120 of the device has the LDD 114 used on the I/O device, and the other side of the gate 120 uses the LDD 116 and the halo 124 of the core (thin gate) device.

It will be seen in both FIGS. 1 and 2, that the source 110 and the drain 112, formed within the respective substrates 102, include extensions shown as bulges 114 and 116, or lateral diffused dopants (LDD), extending laterally toward each other, beneath the thick gate oxide layers. When such LDD 114 and 116 are used with a thick gate oxide layer 118 as shown, the doping at the LDD/channel interface is increased with the halo.

In another embodiment, the thick gate device has the LDD/halo structure on both sides. In another embodiment, the thick gate device has both the LDD structure used for the standard thick gate device, and the LDD/halo structure from the thin gate device, on one or both sides.

Memory Cells Providing Multiple Storage

Figure 3:
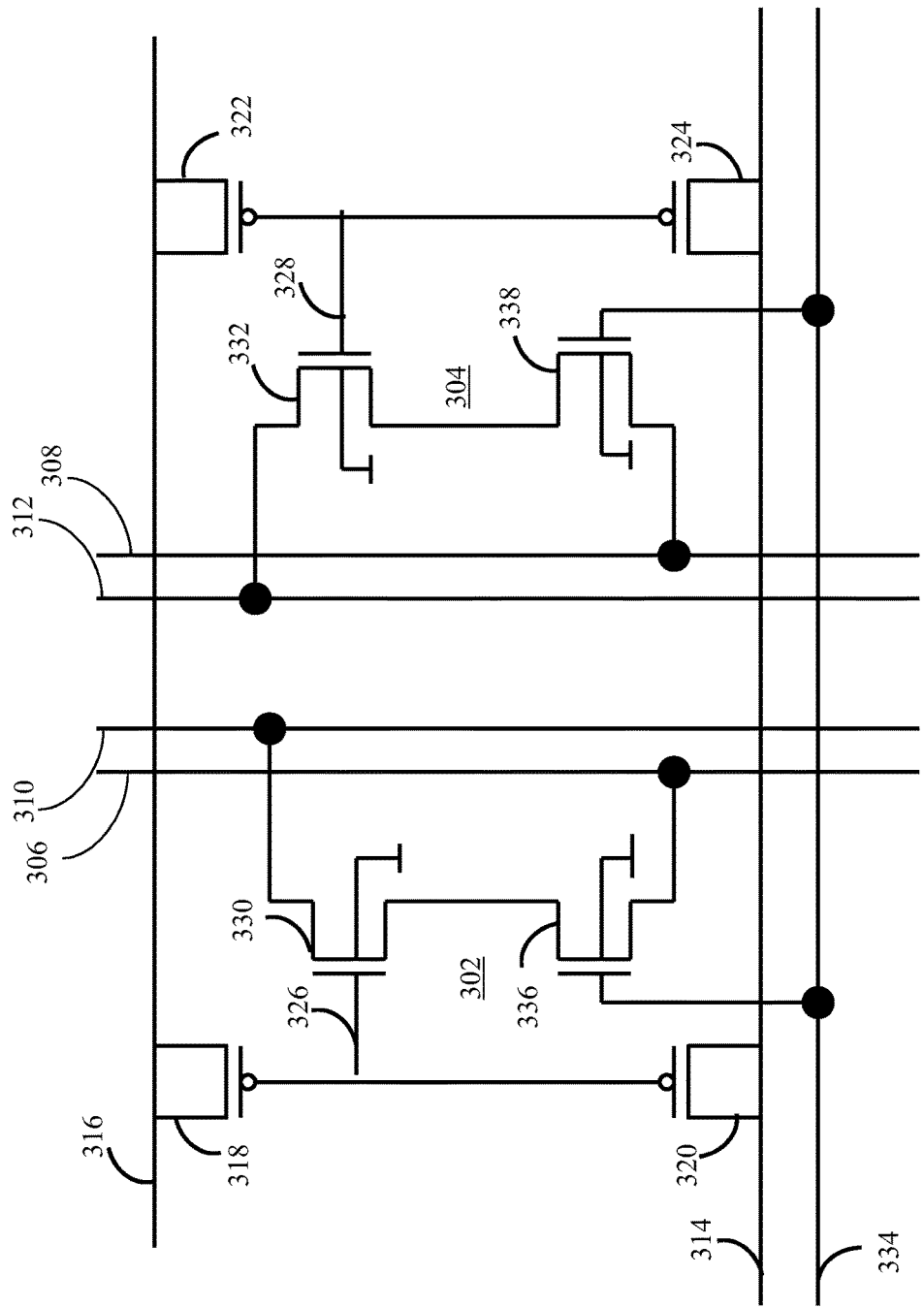
FIG. 3 is a schematic diagram of a memory bit cell circuit, in accordance with one embodiment.

FIG. 3 is a schematic diagram of an embodiment, in which the memory cell providing multiple storage is shown as a differential memory cell incorporating circuit elements fabricated as described with reference to FIGS. 1 and/or 2. Two sides, that is, two series-coupled pairs 302 and 304 of floating gate FETs, are provided; each pair coupled between a respective drain contact point 306 and 308, and a respective bitline 310 and 312. As will be described below, each pair includes a bit storage transistor and a bit select transistor. A program line 314 and an erase line 316 are coupled through control transistors 318, 320, 322, and 324, to provide data on the floating gate signals 326 and 328 to bit storage transistors 330 and 332 of the respective pairs 302 and 304. In this embodiment, the bit storage transistors 330 and 332 are fabricated as shown in FIG. 1. In an alternative embodiment which can be schematically represented similarly, the bit storage transistors are fabricated as shown in FIG. 2. A memory row select line 334 is used to select a row of memory bit cells, including the illustrated differential memory cell. The memory row select line drives the gates of bit select transistors 336 and 338 of the respective pairs 302 and 304. The memory row select line 334, along with the bitlines 310 and 312, drive the bit select transistors 336 and 338 and are used to select the bit storage transistors 330 and 332 individually for programming.

In this circuit, the floating gates of the bit storage transistors 330 and 332 are programmed differentially, around the neutral point. The data state of the memory cell is determined by comparing the current from the two sides. In such a differential circuit, one of the two sides can lose its charge, but the memory cell date is still intact in the other side, so it will still be read correctly.

Figure 4:
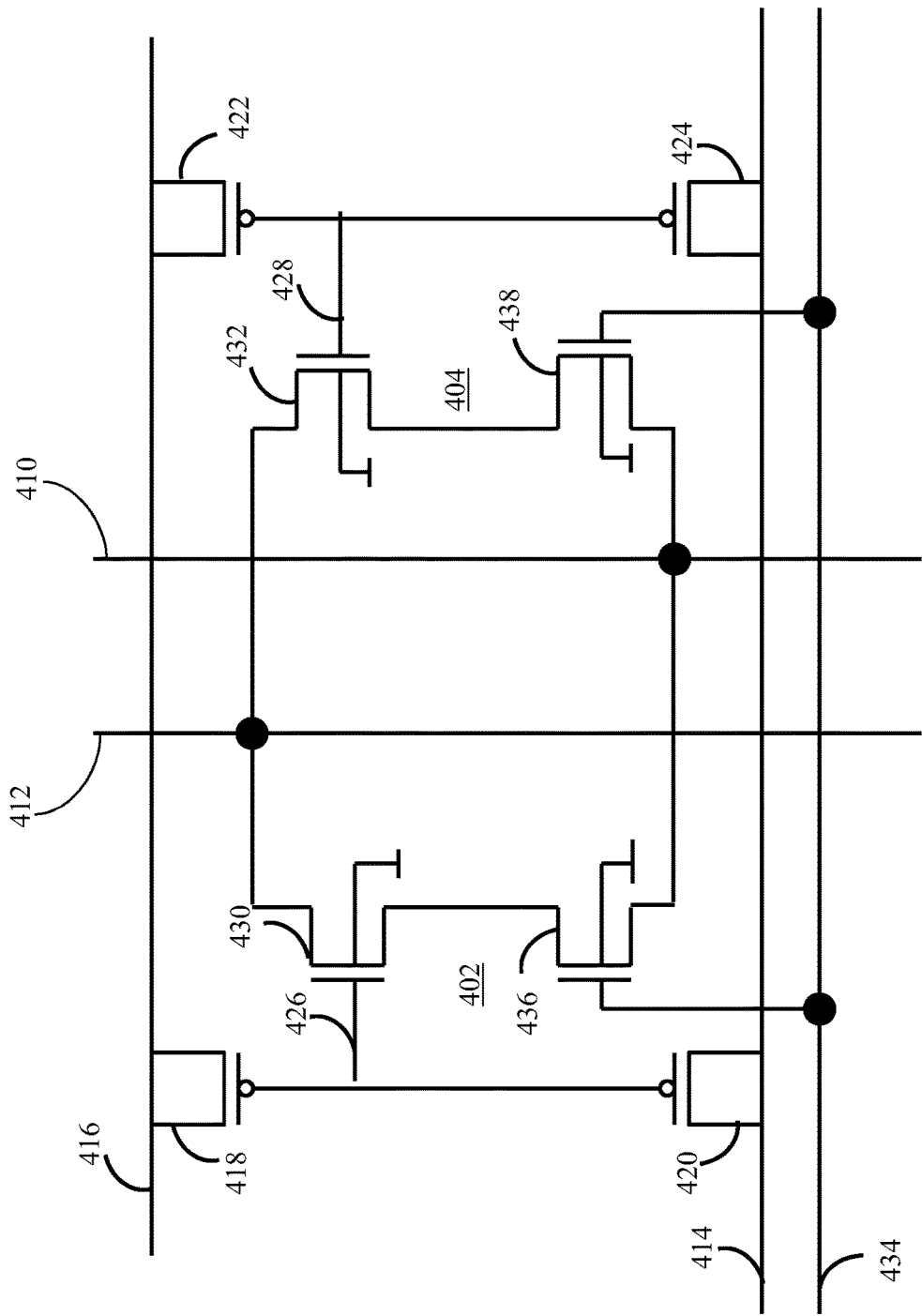
FIG. 4 is a schematic diagram of a memory bit cell circuit, in accordance with another embodiment.

FIG. 4 is a schematic diagram of a redundant memory cell incorporating circuit elements fabricated as described with reference to FIGS. 1 and/or 2. Elements similar to those of FIG. 3 are numbered in a similar manner. However, for this redundant memory cell, the two series-coupled pairs of floating gate FETs 402 and 404 are coupled between a common drain contact point 410, and a common bitline 412.

In a redundant memory cell employing native NMOS technology, the floating gates of the redundant FETs 430 and 432 are both programmed the same way: either high (meaning that the bit is erased), or low (meaning that the bit is programmed). Here, high and low are with reference to the neutral point.

To read the stored bit, the outputs of both floating gate devices 430 and 432 are examined, for instance by summing them together. The outputs are then compared with a reference current, for example a charge neutral current.

Because of the redundancy, even if one of the floating gate devices loses its charge, for example by leaking to the neutral point, the state of the bit cell can still be read correctly. Note that the overall data retention, that is the ability to read a valid data value despite loss of stored charge on one, or even both, of the bit storage transistors on their floating gates, is related to the number of bit storage transistors involved in the storage of the bit value. Thus, in general, the data retention of a memory bit cell that provides multiple storage will vary little, whether the bit storage transistors are at the same value (redundant) or at opposite values (differential). Accordingly, a memory device designer can take advantage of the data retention offered by multiple storage memory bit cells, while relying on other criteria to determine which type of bit cell (differential, redundant, etc.) best meets relevant needs.

For some low power applications, for example RFID tags, the redundant bitcell design has advantages. As shown, there is only one bit line and drain line per bit: This is advantageous, among other reasons, in that it reduces parasitic capacitance, and therefore reduces read current consumption. It reduces routing congestion, resulting in lower fabrication cost, as fewer metal layers are needed. Also the overall program circuit can be smaller in area (that is, wafer real estate) and in power consumption.

Another reason why redundant cell embodiments are advantageous for RFID tag applications is that single and multi-bit programming are supported. Some RFID protocols require a word to be set to all "0"'s and the ability to selectively program various bits to a "1" at different times. With a differential bitcell, to flip the state of a bit, one side of the differential bitcell must be flipped 0→1 and the other side 1→0, (potentially two operations). With a redundant bitcell, both sides start at "0" and are programmed together to "1" in one operation. This saves time and power.

For either a differential or a redundant FG bitcell, the FG must straddle the neutral point. For an unbiased IC, the neutral point is ground. A device with a threshold voltage VT of approximately 0V (+/−100 mV) will straddle the neutral point.

Fabrication Example

Where field effect transistors (FETs) are employed in such devices, the FETs are fabricated generally as follows. A gate oxide layer is fabricated on a substrate. Then, the gate itself is fabricated above the gate oxide layer. The LDD and/or LDD/halo structure is then formed. The spacers are then formed, the source/drain regions are then formed.

The drain and source had been formed by adding dopants to portions of the substrate that are adjacent to, but not in direct contact with, each other. LDD or S/D Ext. can be formed similarly, and coincidentally. The gate oxide layer, formed as described just above, is disposed so the gate can control a channel region that connects to a source and a drain region. When a channel is formed below the gate the source and drain regions are connected through the channel. When the gate is set to a voltage that inhibits a channel, the source and drain regions are isolated from each other.

The Halo (also referred to as pocket implant) is typically fabricated at the same step (for example, a photolithography step) as source/drain Ext. However, a halo can have an angle and higher energy, so it can be done separately.

Combination of a Read Device and a Reference Current Source

In an embodiment, a floating gate non-volatile memory is provided, where a thick gate oxide native device with a halo is used as a read device in the bit cell (see, for instance, FIGS. 1 and 2), and a thick gate oxide native device without a halo can be employed to produce a reference current.

A fast read time for any memory is desirable. To improve read time, high currents (read currents) can be used to increase the response time from the sense amplifiers. The fastest read is with a differential bitcell where one side has high current and the other side has no current. However, a differential bitcell is larger than a single floating gate device per bit, and takes more dynamic power than a redundant bitcell.

A reference current can be used to compare the output of a single ended or redundant bitcell. Such reference current should track the bitcell current over voltage, temperature, or process variation.

Where NVM technology is used for RFID products, thick gate transistors can be used to retain charge on a FG, but the read is done a voltage below the nominal operating voltage of the thin gate transistor in that same process. For example, if a process used 1.8V devices and 3.3V devices, the FG NVM will use the 3.3V device to store a value, but ideally it should be read at ~1V (where the 1.8V device is typically used in that product). The challenge, then, is to instantly read a 3.3V device at ~1V.

A fast read of a single ended or redundant bitcell can be achieved if a reference current is greater than or equal to half of the difference between high and low current states, that is, (high current state–low current state)/2. The data value in the bit cell is retained effectively if the reference current is at the charge neutral point of the FG. For an NMOS device, the charge neutral point is typically at ground, with the device hard off. For a balance between ideal reference for speed ("on" current/2) and retention (Vgate=0V→Ids=0 A), a small reference current is needed.

For low power memories, for example RFID devices, the voltage available is very low. If a charge pump is used to increase the voltage, then there is the drawback that power is consumed. The off state (low current state) of an NVM bitcell at very low voltage is ~0 A. For non-differential bitcells, a reference current greater than 0 A is needed, in order correctly to identify an off FG instantly.

RFID tags spend most time being off (un-powered) and need to wake-up (power-up) quickly for reading. Any reference circuit that requires a long power up time for an analog circuit to settle (stabilize) is undesirable. Also, any circuit that uses power is undesirable.

Therefore, in accordance with an embodiment, a memory cell is provided, including a FG NVM bitcell with a thick gate native device with a halo as the read device of the bitcell, and a thick gate native device without a halo to produce a reference current.

In one such embodiment, a read device can include an NMOS thick gate native device with a halo, having a VT ~+100 mV. The reference current generator can include an NMOS thick gate native device without a halo, having a VT ~-100 mV. Since this device has a negative VT, it will always be on (always have some current and always have more current than the read device).

For a FG NVM bitcell using a native NMOS thick gate with halo device for the read device, the off state will have a voltage less than or equal to 0V on the FG, and the on state will have much greater than 0V on the FG.

A native NMOS thick gate without halo device can be biased with Vgate=0V, to produce a reference current with which to read a FG device. Since both the native thick gate NMOS devices have the same channel doping, gate oxide thickness and gate doping, the devices should closely track each other over variations in voltage, temperature, and process.

Figure 5:
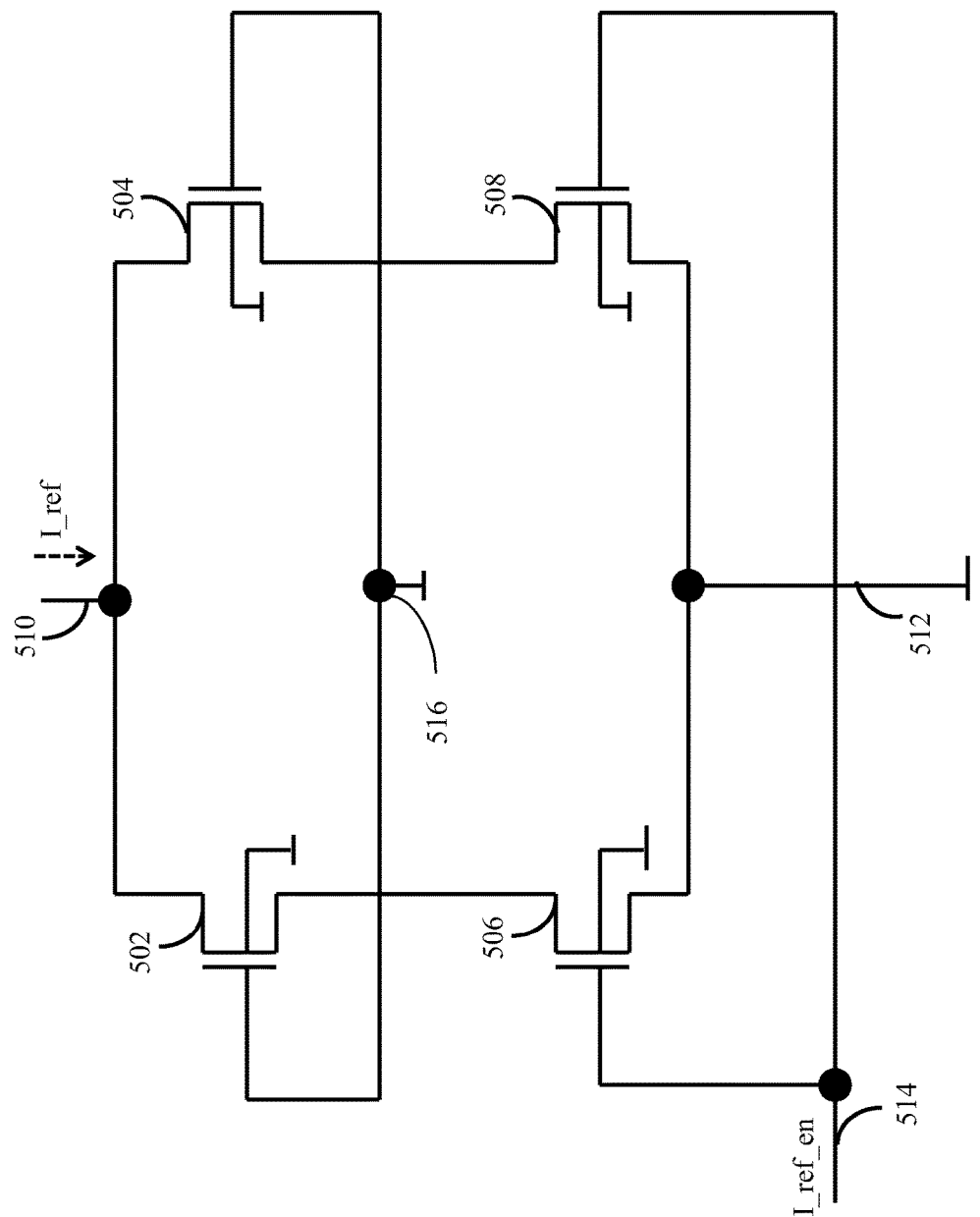
FIG. 5 is a schematic diagram of a circuit for providing a reference current, in accordance with one embodiment.

FIG. 5 is a circuit schematic diagram showing an embodiment of a circuit for producing a reference current, in accordance with the foregoing discussion. The reference current can, for instance, be used with a circuit embodiment of a native NMOS redundant bitcell, for example that of FIG. 4. The reference current circuit includes native NMOS transistors 502 and 504, and transistors 506 and 508. A reference current 510, labeled as I_ref, runs through redundant pathways through the transistors 502 and 506, and through the transistors 504 and 508, to ground 512. Gates of the native NMOS transistors 502 and 504 are wired, for instance to ground 516, so as to enable drain/source current flow. A reference current enable signal 514, labeled I_ref_en, drives gates of the transistors 506 and 508 to enable, or disable, current flow through the transistors 506 and 508, effectively enabling or disabling the reference current 510.

This reference current circuit embodiment provides what is, in effect, a copy of the read path of the bitcell of FIG. 4, that is, the transistors 430, 432, 436 and 438 of FIG. 4. The read devices are biased to the charge neutral point; in this case ground.

The reference current I_ref, illustrated as 510, can in different embodiments be either sourced or sinked, depending on the operation of the bitcell. Typically, for an NMOS bitcell, the current is sinked to ground as shown in FIG. 5. Using a copy of the bitcell, that is, the exact same device sizes and layout as those of FIG. 4, insures that the reference current tracks the bitcell with respect to process variations, temperature, voltage and any other variables. The reference current output can be further optimized by adjusting the physical dimensions of the four devices used. For example, if higher I_ref current is desired, the width of the native NMOS transistors 502 and 504 can be increased.

The transistors 506 and 508, which are connected to the reference current enable signal 514 (labeled I_ref_en) are used to turn the reference current circuit of FIG. 5 on or off. Since the native NMOS transistors 502 and 504 conduct current when corresponding gate is at ground, it is desirable in low power products to turn off the reference circuit 510 (I_ref) when the device (for example, the memory device) is not being used. The ability to quickly turn on and off the reference current 510 is desirable in low power products.

In an embodiment of a memory device, the reference current 510 (I_ref) can go into one side of a sense amplifier for a read operation, or it can first go through a buffer before the sense amplifier. In another embodiment, some current can be added or removed before going into the sense amplifier. In yet another embodiment (not shown), the gate of the native devices can to wired to a voltage other than ground.

Example Operation of an RFID Tag Embodiment

In one embodiment, an entire RFID tag is a solid-state semiconductor integrated circuit, for example, a single silicon or other semiconductor die, mounted onto a carrier. The carrier can, for example, be a piece of paper or acetate. The carrier can have an antenna on it, typically printed on the carrier with conductive ink. An RFID tag is a type of SOC (System On a Chip), since its functionality is on one die. An RFID die typically has control logic, radio frequency modulator/demodulator, power rectifier, non-volatile memory, and other functionality together on one die. RFID tags are preferably as low cost as possible.

Because of the foregoing, an RFID die can be manufactured in a standard CMOS logic process. A standard CMOS logic process is not optimized for NVM. The I/O devices typically have a gate oxide thickness sufficient to retain charge for a floating gate memory. But, the I/O oxide is typically not of sufficient quality to avoid using redundancy.

NVM made in a standard logic process typically provides redundancy, to prevent single floating gate failures from causing data loss. Some RFID protocols require singe bit reads and writes. Error correction codes (ECC) can be used for redundancy. But, ECC if difficult to implement with single bit write requirement and very low power. The redundant bitcell solves the power and redundancy requirements of RFID tags.

In non-volatile memory devices, for example RFID products, it can be the case that a thick gate transistor is needed to retain charge on a floating gate, while the memory is read under conditions where the voltage is below the nominal operating voltage of the thin gate transistor in that same process. For example, if a process used 1.8V devices and 3.3V devices, the floating gate non-volatile memory will use the 3.3V device to store a value in the memory, but it can be read at approximately 1V, although such a product can typically use a 1.8V device. If the device has a typical thick gate VT in a standard logic process of 0.7V, then the bitcell will produce very low current with read at 1V. If a native device with a VT=−0.2V, then there will be more current than with the VT=0.7V device just mentioned. If a modified native thick gate device is used with a VT=0.2V, then there will still be a good amount of current from such a device, when it is in the on state.

In an embodiment, a 3.3V device can instantly be read at approximately 1V. In a single ended or redundant bit cell, the reference current is greater than or equal to (high current state−low current state)/2.

In an embodiment, the reference current should be at the charge neutral point of the floating gate. For an NMOS device, the charge neutral point is typically at ground with the device hard off. For a balance between a reference value optimized for speed (on current/2) and that optimized for data retention in memory (a gate voltage of 0 volts and a drain-to-source current of 0 amps), a small reference current is needed.

The off state (low current state) of an NVM bitcell at very low voltage is ~0 A. For non-differential bitcells, a reference current greater than 0 A is needed to correctly and quickly identify the off state of a floating gate device. A device which spends most of its time off (un-powered), for example an RFID tag, nevertheless can need to wake-up (power-up) instantly for reading. Where a reference circuit is employed, the time required for an analog circuit to settle (stabilize) its reference voltage should preferably be as small as possible.

Performance Characteristics

In an embodiment, in which a floating gate non-volatile memory bitcell includes a thick gate native device with a halo as the read device of the bitcell, and further includes a thick gate native device without a halo to produce a reference current, the embodiment can have the following performance characteristics: An NMOS thick gate native device with a halo can have a VT of around +100 mV. An NMOS thick gate native device without a halo might have a VT of approximately −100 mV. Since this latter device has a negative VT, it will always be on, that is to say it will always have some current, and will always have more current than the bitcell read device (for instance, the bit storage transistors 330 and 332 of FIGS. 3 and 430 and 432 of FIG. 4), biased at the same voltage.

For an embodiment of a floating gate non-volatile memory bitcell using a native NMOS thick gate with halo device for the read device, the off state will have less than 0V on the floating gate, and the on state will have substantially greater than 0V on the floating gate.

A native NMOS thick gate without halo device can be biased with a gate voltage Vgate=0V to produce a reference current to read a FG with. Since both the native thick gate NMOS devices have the same channel doping, gate oxide thickness and gate doping, the devices should closely track each other over voltage/temperature/process.

Applications

Various products employing embodiments, as those described above, will be listed, without limitation.

As noted above, RFID tags can employ embodiments. In particular, an RFID tag embodiment can include a memory bit cell, providing multiple storage and including one or more floating gate FETs as described above in connection with other embodiments. RFID tags can, for instance, have properties, for example non-volatile memory, bit counts for example 2K or below, and a low cost per tag. The RFID tags can have low power requirements, given that there are no on-board power sources and power is obtained from ambient electromagnetic fields. Thus, the RFID tags should operate successfully (with high cycle count and reliability) on voltages which can be lower than would typically be the case (for instance, a 1.8 volt device operated at around 1 volt). There could be mixed analog and digital circuitry on a single semiconductor die. In general, any product which requires low power and high read times could employ embodiments.

Although the disclosed embodiments have been described in detail with reference to particular embodiments, persons possessing ordinary skill in the art will appreciate that various modifications and enhancements can be made without departing from the spirit and scope of the claims that follow.

What is claimed is:

1. A circuit comprising:
   a first non-volatile memory cell comprising a first current-carrying terminal coupled to a first bitline;
   a second non-volatile memory cell comprising a first current-carrying terminal coupled to a second bitline;
   a first select transistor comprising a first current-carrying terminal coupled to a second current-carrying terminal of the first non-volatile memory cell, and a gate terminal coupled to a select line; and
   a second select transistor comprising a first current-carrying terminal coupled to a second current-carrying terminal of the second non-volatile memory cell, and a gate terminal coupled to the select line.

2. The circuit of claim 1 wherein each of the first and second non-volatile memory cells further comprises:
   a drain region having a lightly doped implant.

3. The circuit of claim 2 wherein the drain region of each of the first and second non-volatile memory cells further comprises a halo implant.

4. The circuit of claim 2 where each of the first and second non-volatile memory cells further comprises:
   a source region having a lightly doped implant.

5. The circuit of claim 3 where each of the first and second non-volatile memory cells further comprises:
   a source region having lightly doped and halo implants.

6. A circuit comprising:
   a first non-volatile memory cell comprising a first current-carrying terminal coupled to a bitline;
   a second non-volatile memory cell comprising a first current-carrying terminal coupled to the bitline;
   a first select transistor comprising a first current-carrying terminal coupled to a second current-carrying terminal of the first non-volatile memory cell, and a gate terminal coupled to a select line; and a second select transistor comprising a first current-carrying terminal coupled to a second current-carrying terminal of the second non-volatile memory cell, and a gate terminal coupled to the select line.

7. The circuit of claim 6 wherein each of the first and second non-volatile memory cells further comprises:

a drain region having a lightly doped implant.

8. The circuit of claim 7 wherein the drain region of each of the first and second non-volatile memory cell further comprises a halo implant.

9. The circuit of claim 7 wherein each of the first and second non-volatile memory cells further comprises:

a source region having a lightly doped implant.

10. The circuit of claim 8 wherein each of the first and second non-volatile memory cells further comprises:

a source region having lightly doped and halo implants.

* * * * *